United States Patent
Matsumoto

[19]
[11] Patent Number: 6,104,964
[45] Date of Patent: Aug. 15, 2000

[54] PROCESSING RATE CALCULATION APPARATUS, A PROCESSING RATE CALCULATION METHOD, AND A COMPUTER READABLE RECORDING MEDIUM HAVING THEREON A PROCESSING RATE CALCULATION PROGRAM

[75] Inventor: Shigeru Matsumoto, Osaka, Japan

[73] Assignee: Matsushita Electric Industrial Co., Ltd., Osaka, Japan

[21] Appl. No.: 09/018,444

[22] Filed: Feb. 4, 1998

[30] Foreign Application Priority Data

Feb. 6, 1997 [JP] Japan .................................... 9-023774

[51] Int. Cl.$^7$ ........................................................ G06F 19/00
[52] U.S. Cl. .............................. 700/108; 700/73; 700/74; 700/116; 700/119; 700/46; 702/81; 702/82; 702/89
[58] Field of Search ...................... 700/46, 73, 74, 700/108–110, 116–119; 702/81, 82, 83, 84, 89

[56] References Cited

U.S. PATENT DOCUMENTS

| | | |
|---|---|---|
| 4,263,010 | 4/1981 | Randolph ................................ 23/230 A |
| 5,367,699 | 11/1994 | Lange et al. ............................. 395/800 |
| 5,503,707 | 4/1996 | Maung et al. ......................... 156/626.1 |
| 5,754,452 | 5/1998 | Pupalaikis .............................. 700/108 |
| 5,816,285 | 10/1998 | Ohmi et al. ......................... 137/487.5 |
| 5,875,109 | 2/1999 | Federspiel ................................ 700/46 |
| 5,930,138 | 7/1999 | Lin et al. ................................ 700/108 |
| 5,937,364 | 8/1999 | Westgard et al. ...................... 700/108 |
| 5,966,312 | 10/1999 | Chen ...................................... 700/108 |

*Primary Examiner*—Paul P. Gordon
*Assistant Examiner*—Ramesh Patel
*Attorney, Agent, or Firm*—McDermott, Will & Emery

[57] ABSTRACT

A processing result storage device stores data on the results of an etching apparatus having processed a product. An apparatus property storage device stores data which indicate the property of the etching apparatus as processing property data. A process stability judgment device judges the stability of a step based on the processing result data stored in the processing result storage device and the apparatus property data stored in the apparatus property storage device. When the process stability judgment device has judged the step to be stable, the processing rate automatic calculation device calculates an etching rate. On the other hand, when the process stability judgment device has judged the step to be unstable, the processing rate recalculation device calculates an etching rate, based on the results of the etching apparatus having actually etched. The processing requirement determination device determines the etching requirements from the calculated etching rate.

7 Claims, 7 Drawing Sheets

PROCESSING RESULT DATA → STORAGE OF PROCESSING DATE, ETCHING TIME, ETCHING FILM THICKNESS, AND ETCHING RATE — REPEATED AT EVERY ETCHING PROCESS

APPARATUS PROPERTY DATA → STORAGE OF PROCESSING DATE, PARTICLE NUMBERS — REPEATED AT EVERY CONFIRMATION OF PROPERTIES

Fig. 6

PROCESSING RESULT TABLE

| PROCESSING DATE | ETCHING TIME (sec) | ETCHING FILM THICKNESS (nm) | ETCHING RATE (nm/sec) |
|---|---|---|---|
| : | : | : | : |
| 1996/10/21 | 100 | 950 | 9.5 |
| 1996/10/22 | 10 | 130 | 13.0 |
| 1996/10/23 | 28 | 270 | 9.6 |
| 1996/10/24 | 20 | 200 | 10.0 |
| 1996/10/25 | 18 | 190 | 10.6 |
| 1996/10/26 | 36 | 390 | 10.8 |
|  |  |  |  |

Fig. 7

APPARATUS PROPERTY TABLE

| PROCESSING DATE | PARTICLE NUMBER (piece) |
|---|---|
| ⋮ | ⋮ |
| 1996/10/21 | 4 |
| 1996/10/22 | 29 |
| 1996/10/23 | 37 |
| 1996/10/24 | 26 |
| 1996/10/25 | 89 |
| 1996/10/26 | 8 |
|  |  |

PROCESSING RATE CALCULATION APPARATUS, A PROCESSING RATE CALCULATION METHOD, AND A COMPUTER READABLE RECORDING MEDIUM HAVING THEREON A PROCESSING RATE CALCULATION PROGRAM

BACKGROUND OF THE INVENTION

The present invention relates to a processing rate calculation apparatus, a processing rate calculation method, and a computer readable recording medium having thereon a processing rate calculation program. To be more specific, the present invention relates to a processing rate calculation apparatus, a processing rate calculation method, and a computer readable recording medium having thereon a processing rate calculation program when a product is processed by using a processing apparatus which must determine processing requirements (such as film accumulation requirements or film etching requirements) by estimating them from a processing rate (such as a film accumulation rate or a film etching rate) and which must determine processing requirements just before the processing because processing properties are unstable (for example, the processing rate differs from day to day or the number of particles differs from apparatus to apparatus).

A conventional processing requirement determination apparatus will be described as follows with reference to FIG. 8.

FIG. 8 shows the entire structure of the conventional processing requirement determination apparatus, which comprises a processing rate calculation means 1 for calculating a processing rate, and a processing requirement determination means 2 for determining processing requirements. The processing rate calculation means 1 performs provisional processing by using a product monitor before starting the processing of a product in a specific process, and then calculates a processing rate based on the results of the provisional processing. The processing requirement determination means 2 determines processing requirements based on the processing rate calculated by the processing rate calculation means 1.

As mentioned above, the conventional processing requirement determination apparatus performs provisional processing by using a product monitor before starting the processing of a product, then calculates a processing rate based on the results of the provisional processing, and determines processing requirements based on the calculated processing rate. This procedure causes a problem that it takes a lot of time to determine the processing requirements, which results from the large amount of time required for calculating a processing rate.

SUMMARY OF THE INVENTION

In view of the foregoing problem, the object of the present invention is to reduce the time required for calculating a processing rate.

In order to achieve the object, the present invention takes it into consideration that there is a difference in the stability of a processing process or a processing apparatus, and when the stability of the processing process or the processing apparatus is high, the processing rate is calculated based on stored data, without performing provisional processing with a product monitor.

To be more specific, a first processing rate calculation apparatus of the present invention comprises: a processing result storage means for storing the processing results of a plurality of processes as processing result data; a stability judgment means for judging the stability of a processing process which is a processing object of the plurality of processes, based on the processing result data stored in the processing result storage means; a first processing rate calculation means for calculating a processing rate at which the processing process is performed, based on the processing result data stored in the processing result storage means, when the stability judgment means has judged the processing process to be stable; and a second processing rate calculation means for calculating a processing rate at which the processing process is performed by actually performing the processing process, when the stability judgment means has judged the processing process to be unstable.

According to the first processing rate calculation apparatus, when the stability judgment means has judged the processing process to be stable, the processing rate at which the processing process is performed is calculated based on the processing result data stored in the processing result storage means. Consequently, the processing rate can be calculated without taking the trouble to actually perform the processing process, which can reduce the time required for calculating the processing rate.

In the first processing rate calculation apparatus, it is preferable that the processing result data stored in the processing result storage means include processing dates and processing rates, and the stability judgment means includes a means for judging stability of the processing process based on variations of the processing rates during a specified time period which are included in the processing result data. As a result, the reliability of a calculated processing rate is enhanced.

A second processing rate calculation apparatus of the present invention comprises: an apparatus property storage means for storing processing results of a specific apparatus having performed a plurality of processes, as apparatus property data; a stability judgment means for judging stability of the specific apparatus, based on the apparatus property data stored in the apparatus property storage means; a first processing rate calculation means for calculating a processing rate at which the specific apparatus performs a processing process which is a processing object, based on the apparatus property data stored in the apparatus property storage means, when the stability judgment means has judged the specific apparatus to be stable; and a second processing rate calculation means for calculating a processing rate at which the specific apparatus performs the processing process by making the specific apparatus actually perform the processing process, when the stability judgment means has judged the specific apparatus to be unstable.

According to the second processing rate calculation apparatus, when the stability judgment means has judged the specific apparatus to be stable, the processing rate at which the specific apparatus performs the processing process is calculated based on the apparatus property data stored in the apparatus property storage means. Consequently, the processing rate can be calculated without taking the trouble to actually perform the processing process by using the specific apparatus, which can reduce the time required for calculating the processing rate.

In the second processing rate calculation apparatus, it is preferable that the apparatus property data stored in the apparatus property storage means include processing dates and particle numbers, and the stability judgment means includes a means for judging stability of the specific apparatus based on variations of the particle numbers during a specified time period which are included in the apparatus property data. As a result, the reliability of a calculated processing rate is enhanced.

A third processing rate calculation apparatus of the present invention comprises: a processing result storage means for storing processing results of a plurality of processes which belong to a first group, as processing result data; an apparatus property storage means for storing processing results of a plurality of processes which belong to a second group and which are performed by a specific apparatus, as apparatus property data; a stability judgment means for judging stability of a processing process which belongs to both the first group and the second group and which is a processing object of the specific apparatus, based on the processing result data stored in the processing result storage means and the apparatus property data stored in the apparatus property storage means; a first processing rate calculation means for calculating a processing rate at which the specific apparatus performs the processing process, based on the processing result data stored in the processing result storage means or the apparatus property data stored in the apparatus property storage means, when the stability judgment means has judged the processing process performed by the specific apparatus to be stable; and a second processing rate calculation means for calculating a processing rate at which the specific apparatus performs the processing process by making the specific apparatus actually perform the processing process, when the stability judgment means has judged the processing process to be unstable.

According to the third processing rate calculation apparatus, when the stability judgment means has judged the processing process performed by the specific apparatus to be stable, a processing rate at which the specific apparatus performs the processing process is calculated based on the processing result data stored in the processing result storage means or the apparatus property data stored in the apparatus property storage means. Consequently, the processing rate can be calculated without taking the trouble to actually perform the processing process by using the specific apparatus, which can reduce the time required for calculating the processing rate.

In the third processing rate calculation apparatus, it is preferable that the processing result data stored in the processing result storage means include processing dates and processing rates, and the apparatus property data stored in the apparatus property storage means include processing dates and particle numbers; and the stability judgment means includes a means for judging stability of the processing process performed by the specific apparatus based on variations of the processing rates during a specified time period which are included in the processing result data or on variations of the particle numbers during a specified time period which are included in the apparatus property data. As a result, the reliability of a calculated processing rate is enhanced.

A first processing rate calculation method of the present invention comprises the steps of: storing processing results of a plurality of processes as processing result data; judging stability of a processing process which is a processing object of the plurality of processes, based on the stored processing result data; and calculating a processing rate at which the processing process is performed, based on the stored processing result data when the processing process has been judged to be stable, or calculating a processing rate at which the processing process is performed by actually performing the processing process when the processing process has been judged to be unstable.

According to the first processing rate calculation method, when the processing process has been judged to be stable in the stability judgment step, a processing rate at which the processing process is performed is calculated based on the processing result data stored in the processing result storage step. Consequently, the processing rate can be calculated without taking the trouble to actually perform the processing process, which can reduce the time required for calculating the processing rate.

In the first processing rate calculation method, it is preferable that the stored processing result data include processing dates and processing rates, and the step of judging the stability includes a step of judging stability of the processing process based on variations of the processing rates during a specified time period which are included in the processing result data. As a result, the reliability of a calculated processing rate is enhanced.

A second processing rate calculation method of the present invention comprises the steps of: storing, as apparatus property data, processing results of a specific apparatus having performed a plurality of processes; judging the stability of the specific apparatus, based on the stored apparatus property data; and calculating a processing rate at which the specific apparatus performs a processing process which is a processing object, based on the apparatus property data, when the specific apparatus has been judged to be stable, or calculating a processing rate at which the specific apparatus performs the processing process by making the specific apparatus actually perform the processing process, when the specific apparatus has been judged to be unstable.

According to the second processing rate calculation method, when the specific apparatus has been judged to be stable in the stability judgment step, the processing rate at which the specific apparatus performs the processing process is calculated based on the stored apparatus property data. Consequently, the processing rate can be calculated without taking the trouble to actually perform the processing process by using the specific apparatus, which can reduce the time required for calculating the processing rate.

In the second processing rate calculation method, it is preferable that the apparatus property data stored include processing dates and particle numbers, and the step of judging the stability of the specific apparatus includes a step of judging the stability of the specific apparatus based on variations of the particle numbers during a specified time period which are included in the apparatus property data. As a result, the reliability of a calculated processing rate is enhanced.

A third processing rate calculation method of the present invention is comprises the steps of: storing, as processing result data, processing results of a plurality of processes which belong to a first group, storing, as apparatus property data, processing results of a plurality of processes which belong to a second group and which are performed by a specific apparatus; judging stability of a processing process which belongs to both the first group and the second group and which is a processing object of the specific apparatus, based on the processing result data and the apparatus property data stored; and calculating a processing rate at which the specific apparatus performs the processing process, based on the stored processing result data or the stored apparatus property data, when the processing process performed by the specific apparatus has been judged to be stable, or calculating a processing rate at which the specific apparatus performs the processing process by making the specific apparatus actually perform the processing process, when the processing process performed by the specific apparatus has been judged to be unstable.

According to the third processing rate calculation method, when the processing process performed by the specific apparatus has been judged to be stable in the stability judgment step, a processing rate at which the specific apparatus performs the processing process is calculated based on the processing result data stored in the processing result storage step or the apparatus property data stored in the apparatus property storage step. Consequently, the processing rate can be calculated without taking the trouble to actually perform the processing process by using the specific apparatus, which can reduce the time required for calculating the processing rate.

In the third processing rate calculation method, it is preferable that the stored processing result data include processing dates and processing rates, and the stored apparatus property data include processing dates and particle numbers; and the step of judging the stability of the processing process includes a step of judging the stability of the processing process performed by the specific apparatus based on variations of the processing rates during a specified time period which are included in the processing result data or on variations of the particle numbers during a specified time period which are included in the apparatus property data. As a result, the reliability of a calculated processing rate is enhanced.

A first computer readable recording medium of the present invention is a computer readable recording medium having thereon a processing rate calculation program for calculating a processing rate, comprising: a processing result storage procedure for storing processing results of a plurality of processes as processing result data; a stability judgment procedure for judging stability of a processing process which is a processing object of the plurality of processes, based on the processing result data stored in the processing result storage procedure; and a processing rate calculation procedure for calculating a processing rate at which the processing process is performed, based on the processing result data stored in the processing result storage procedure, when the processing process has been judged to be stable in the stability judgment procedure, or for calculating a processing rate at which the processing process is performed by actually performing the processing process, when the processing process has been judged to be unstable in the stability judgment procedure.

In the first computer readable recording medium, it is preferable that the processing result data stored in the processing result storage procedure include processing dates and processing rates, and the stability judgment procedure includes a procedure for judging the stability of the processing process based on variations of the processing rates during a specified time period which are included in the processing result data.

A second computer readable recording medium of the present invention is a computer readable recording medium having thereon a processing rate calculation program for calculating a processing rate, comprising: an apparatus property storage procedure for storing processing results of a specific apparatus having performed a plurality of processes, as apparatus property data; a stability judgment procedure for judging stability of the specific apparatus, based on the apparatus property data stored in the apparatus property storage procedure; and a processing rate calculation procedure for calculating a processing rate at which the specific apparatus performs a processing process which is a processing object, based on the apparatus property data stored in the apparatus property storage means, when the specific apparatus has been judged to be stable in the stability judgment procedure, or calculating a processing rate at which the specific apparatus performs the processing process by making the specific apparatus actually perform the processing process, when the specific apparatus has been judged to be unstable in the stability judgment procedure.

In the second computer readable recording medium, it is preferable that the apparatus property data stored in the apparatus property storage procedure include processing dates and particle numbers, and the stability judgment procedure includes a procedure for judging the stability of the specific apparatus based on variations of the particle numbers during a specified time period which are included in the apparatus property data.

A third computer readable recording medium of the present invention is a computer readable recording medium having thereon a processing rate calculation program for calculating a processing rate, comprising: a processing result storage procedure for storing processing results of a plurality of processes which belong to a first group, as processing result data; an apparatus property storage procedure for storing processing results of a plurality of processes which belong to a second group and which are performed by a specific apparatus, as apparatus property data; a stability judgment procedure for judging stability of a processing process which belongs to both the first group and the second group and which is a processing object of the specific apparatus, based on the processing result data stored in the processing result storage procedure and the apparatus property data stored in the apparatus property storage procedure; and a processing rate calculation procedure for calculating a processing rate at which the specific apparatus performs the processing process, based on the processing result data stored in the processing result storage procedure or the apparatus property data stored in the apparatus property storage procedure, when the processing process performed by the specific apparatus has been judged to be stable in the stability judgment procedure, or calculating a processing rate at which the specific apparatus performs the processing process by making the specific apparatus actually perform the processing process, when the processing process performed by the specific apparatus has been judged to be unstable in the stability judgment procedure.

In the third computer readable recording medium, the processing result data stored in the processing result storage procedure include processing dates and processing rates, and the apparatus property data stored in the apparatus property storage procedure include processing dates and particle numbers; and the stability judgment procedure includes a procedure for judging stability of the processing process performed by the specific apparatus based on variations of the processing rates during a specified time period which are included in the processing result data or on variations of the particle numbers during a specified time period which are included in the apparatus property data.

According to the computer readable recording medium having thereon a processing rate calculation program which makes a computer realize one of the processing rate calculation methods of the present invention, the processing rate calculation method can be executed without fail by making the computer execute the processing rate calculation program stored in the recording medium.

BRIEF DESCRIPTION OF THE DRAWINGS

FIG. 6 is a processing result table used in the processing requirement determination apparatus and the processing requirement determination method.

FIG. 7 is a processing property table used in the processing requirement determination apparatus and the processing requirement determination method.

DESCRIPTION OF THE PREFERRED EMBODIMENT

The processing rate calculation apparatus, the processing rate calculation method, and the computer readable recording medium having thereon a processing rate calculation program of the embodiment of the present invention will be described as follows with reference to the drawings.

Figure 1:
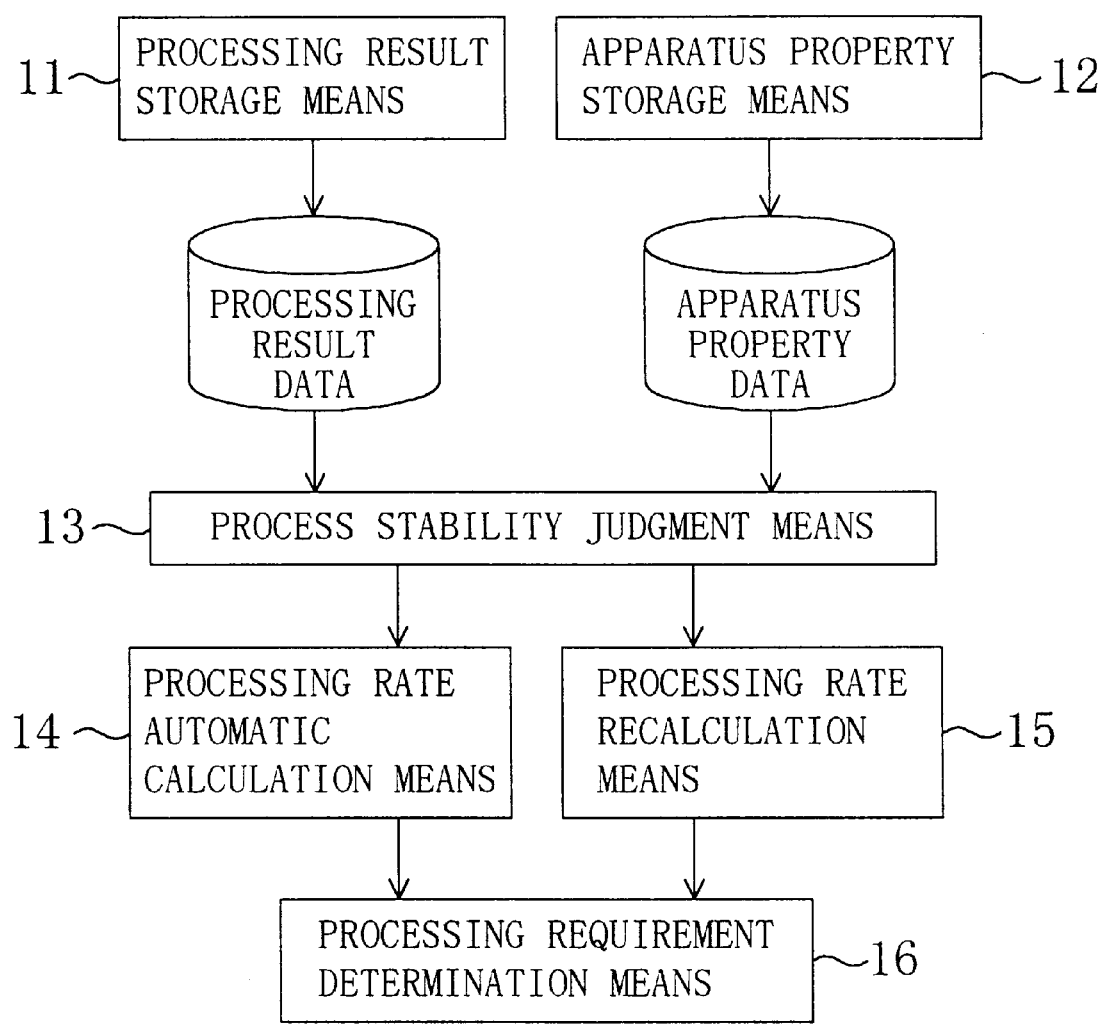
FIG. 1 is a block diagram illustrating a processing requirement determination apparatus having the processing rate calculation apparatus of the embodiment of the present invention.
Figure 2:
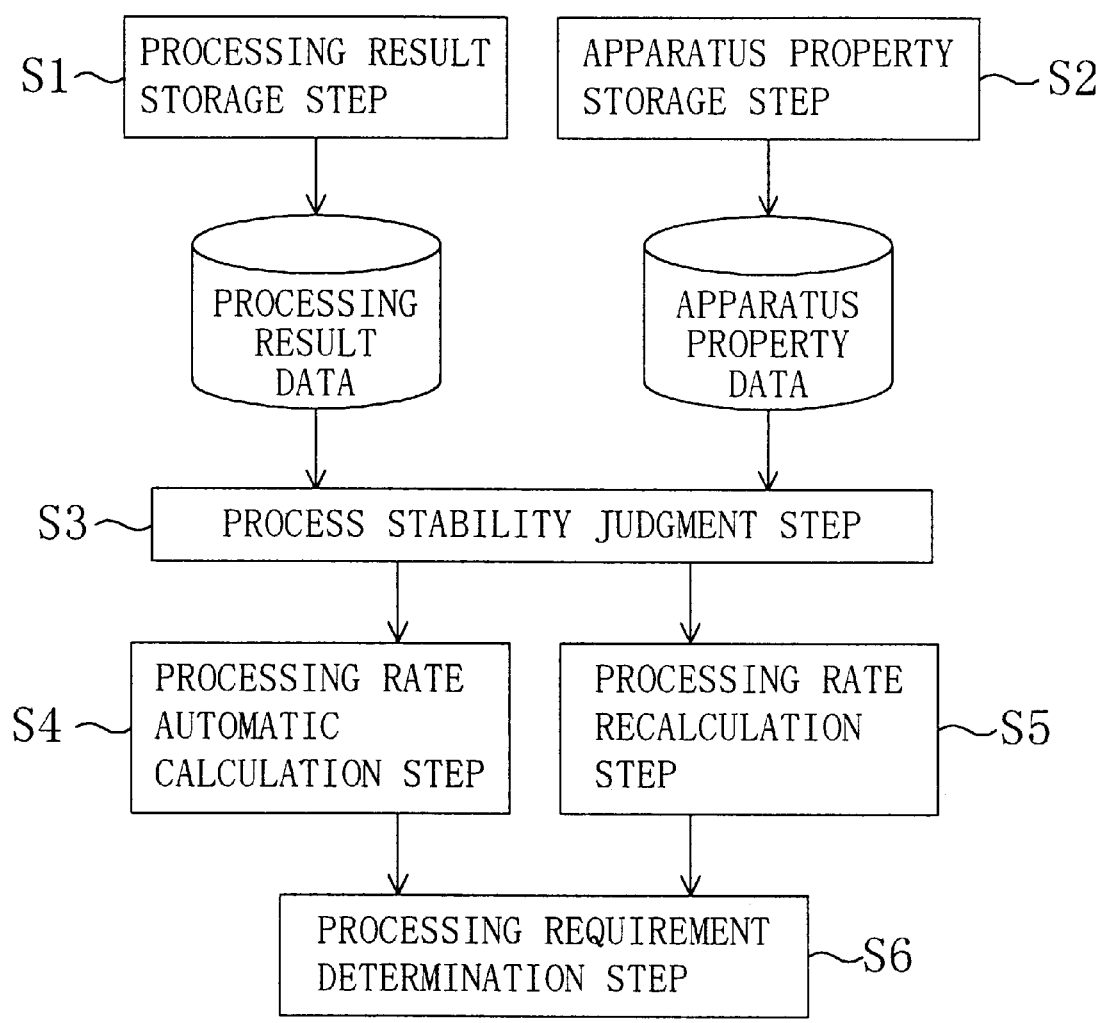
FIG. 2 is a flowchart illustrating a processing requirement determination method having the processing rate calculation method of the embodiment of the present invention.

FIG. 1 is a block diagram illustrating a processing requirement determination apparatus having a processing rate calculation apparatus of the embodiment of the present invention, and FIG. 2 is a flowchart illustrating a processing requirement determination method having the processing rate calculation method of the embodiment.

As shown in FIG. 1, the processing requirement determination apparatus comprises a processing result storage means 11 for storing the processing results of a process, an apparatus property storage means 12 for storing the properties of the apparatus, a process stability judgment means 13 for judging the stability of the process based on the processing results of the process and the properties of the apparatus which have been stored, a processing rate automatic calculation means 14 as a first processing rate calculation means for automatically calculating a processing rate based on the stored processing results, when the process has been judged to be stable, a processing rate recalculation means 15 as a second processing rate calculation means for recalculating the processing rate by actually performing the process, when the process has been judged to be unstable, and a processing requirement determination means 16 for determining processing requirements from the calculated processing rate.

The processing requirement determination method by using the above-mentioned processing requirement determination apparatus will be described as follows with reference to FIGS. 2 to 7, by taking the case of determining processing requirements for the etching of an etching apparatus.

Figure 3:
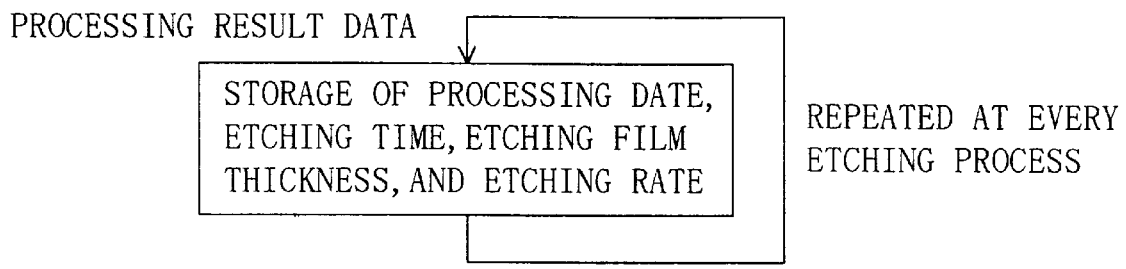
FIG. 3 is a diagram illustrating a process according to which data obtained as a result of an etching apparatus having processed a product is stored as processing result data in the processing result storage means of the above-mentioned processing requirement determination apparatus.

The processing result storage means 11 stores data on the results of a product having been processed by an etching apparatus as processing result data in step S1. To be more specific, as shown in FIG. 6, in the processing result table which contains a processing date, an etching time, the thickness of an etching film, and an etching rate as its items, a processing date, an etching time, and the thickness of an etching film are registered. Also, an etching rate, which is calculated by dividing the thickness of an etching film by the etching time is registered. As shown in FIG. 3, the processing result data is registered every time an etching process is applied to a product. The location of forming the processing result table is not specified and can be anywhere on an accessible computer.

Figure 4:
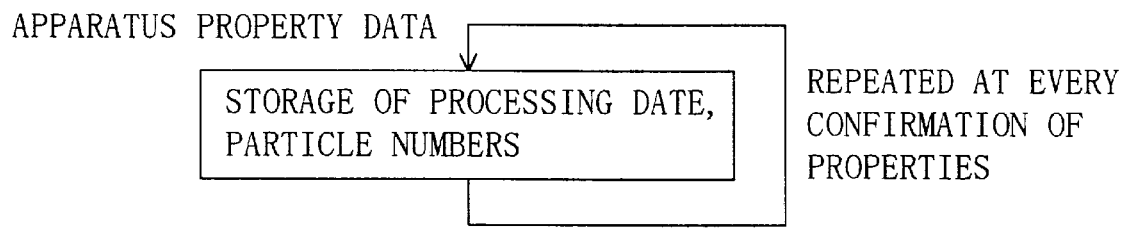
FIG. 4 is a diagram illustrating a process according to which data indicating the properties of the etching apparatus is stored as processing property data in the apparatus property storage means of the above-mentioned processing requirement determination apparatus.

The apparatus property storage means 12 stores data which indicate the properties of the etching apparatus as processing property data in step S2. To be more specific, as shown in FIG. 7, a processing time and a particle number are registered in the apparatus property table which contains a processing date and a particle number as its items. As shown in FIG. 4, the processing property data are registered every time the performance of the etching apparatus is confirmed. As the property data to be registered in the apparatus property table, data which indicate the performance of the etching apparatus such as plasma density can be selected in addition to the particle number. The location of forming the apparatus property table is not specified and can be anywhere on an accessible computer.

The process stability judgment means 13 judges the stability of the process based on the processing result data stored in the processing result storage means 11 and the apparatus property data stored in the apparatus property storage means 12 in step S3 before applying an etching process to a product.

Figure 5:
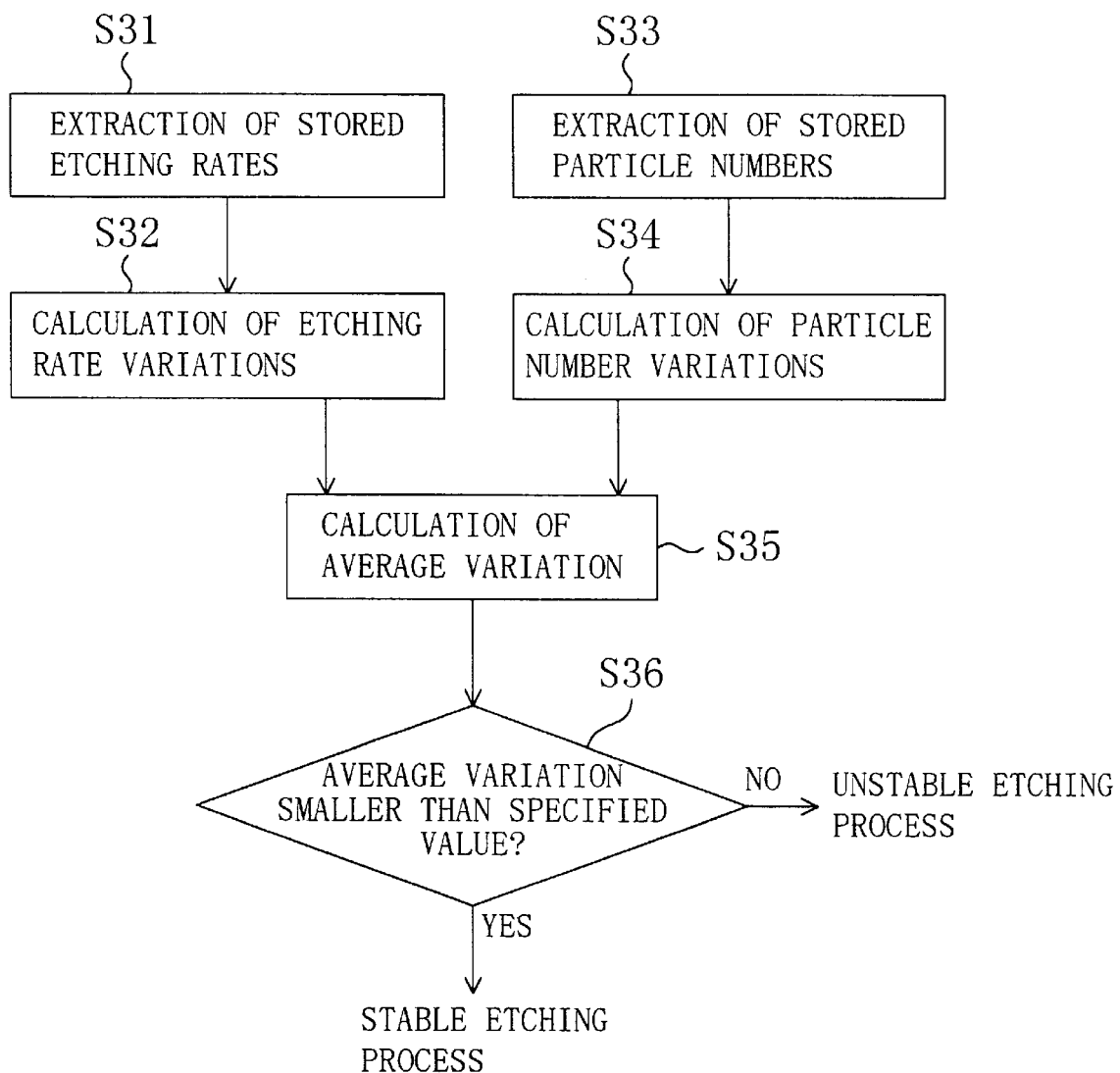
FIG. 5 is a flowchart illustrating each process of the process stability judgment step in the processing requirement determination method.
Figure 8:
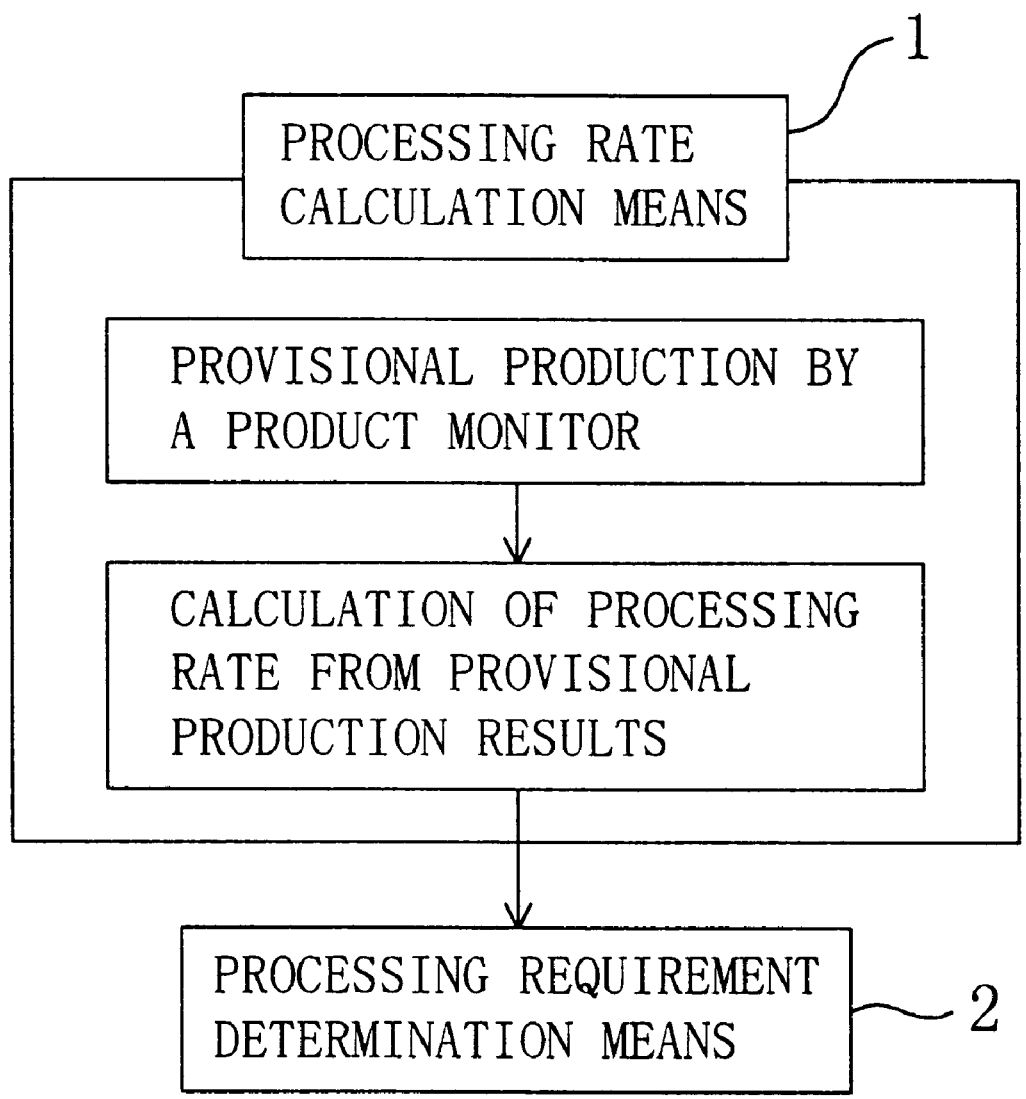
FIG. 8 is a block diagram showing a conventional processing requirement determination apparatus.

The way of the process stability judgment means 13 judging the stability of a process in step S3 will be described as follows with reference to the flowchart shown in FIG. 5.

In step S31, stored etching rates are extracted. To be more specific, five recent etching rates are extracted from the data in the processing result table shown in FIG. 6; the order is from most to least recent, by using the processing dates in the table as retrieval key.

In step S32, the standard deviations of the extracted five etching rates are calculated in order to examine their variation. The number of data to be extracted is not limited to five; it can be any other number. The index of the variation is not limited to the standard deviation; it can be a deviation, the sum of squares, a dispersion, a range, or a change rate.

In step S33, stored particle numbers are extracted. To be more specific, five recent particle numbers are extracted from the data in the apparatus property table shown in FIG. 7; the order is from most to least recent, by using the processing dates in the table as retrieval key.

In step S34, the standard deviations of the extracted five particle numbers are calculated in order to examine their variation. The number of data to be extracted is not limited to five; it can be any number. The index of the variation is not limited to the standard deviation; it can be a deviation, the sum of squares, a dispersion, a range, or a change rate.

In step S35, the average value of the standard deviations of the etching rates and the standard deviations of the particle numbers, that is, the average value of the variations is calculated.

In step S36, it is judged whether the average value of the variations is smaller than a specified value or not, that is, whether the process is stable or not. To be more specific, when the average value of the variations is smaller than the specified value (for example, 5), then the process is judged to be "stable", whereas when it is larger than the specific value, then the process is judged to be "unstable". Before the average value is calculated from the two standard deviations, each value may be weighed in accordance with the properties of the extracted data. For example, recent data may be multiplied with a number larger than 1. The specified value can be determined in accordance with the properties of the apparatus.

When the process stability judgment means 13 judges the stability of a process in step S3, the average value of the standard deviations of the etching rates calculated in step S35 is used; however, either the standard deviations of the etching rates or the standard deviations of the particle numbers can be used solely.

When the process stability judgment means 13 has judged a process to be "stable" in step S3, the processing rate automatic calculation means 14 calculates an etching rate as a processing rate in step S4 before an etching process is applied to a product. To be more specific, five recent etching rates are extracted from the data in the processing result table shown in FIG. 6; the order is from most to least recent, by using the processing dates in the table as retrieval key. Then, the average value of the extracted five recent etching rates is calculated. The number of data to be extracted is not limited to five; it can be any other number, and the number can be different from the number of data extracted in step S31. Before the average value of the etching rates is calculated, each data may be weighed in accordance with the properties of the apparatus.

On the other hand, when the process stability judgment means 13 has judged a process to be "unstable" in step S3, the processing rate recalculation means 15 calculates an etching rate in step S5 before an etching process is applied to a product. The method of calculating an etching rate is not specified: an etching rate can be calculated from the results of the actual etching of an etching apparatus. For example, an etching rate can be calculated by means of a provisional etching using an etching monitor, which has been conventionally conducted.

The processing requirement determination means 16 determines etching requirements in step S6 from the etching rate calculated by either the processing rate automatic calculation means 14 or the processing rate recalculation means 15. To be more specific, the processing requirement determination means 16 determines an etching time by dividing the thickness of the etching film of a product by the etching rate calculated by either the processing rate automatic calculation means 14 or the processing rate recalculation means 15.

As described hereinbefore, according to the processing rate calculation method and the processing rate calculation apparatus of the present embodiment, the method of calculating an etching rate is changed depending on the stability of the etching process: when the process has high stability, the etching rate is automatically calculated from the stored etching rates, without performing a provisional etching with an etching monitor. Consequently, the time required for calculating an etching rate can be reduced.

When the processing result data or the apparatus property data is stored in the processing result storage means 11 or the apparatus property storage means 12, the table shown in FIG. 6 or FIG. 7 can be replaced by a list structure (a structure stored in memory of a computer) or the like.

The processing requirements referred to in the present invention include, in addition to the processing requirements of an etching apparatus, processing requirements when a product is produced by using a production apparatus which must determine the processing requirements by estimating them from the processing rate and which must re-determine the processing requirements just before the processing because of the unstable process stability, such as a CVD apparatus, a spatter apparatus, an exposure apparatus, or an oxidation apparatus.

Consequently, by forming a processing rate calculation program which realizes the processing rate calculation method of the present embodiment and by storing the processing rate calculation program in a computer readable recording medium, when the recording medium is installed in the subsidiary storage device of a computer, the processing rate calculation program of the present embodiment is loaded in the main storage device of the computer, so that the specified function of each procedure is executed by the CPU of the computer in response to the occurrence of a specified operating timing (event).

What is claimed is:

1. A process rate calculation method comprising the steps of:
    storing, as process result data, deposition rates or etching rates resulting from performing a first group of processes using a process-performing apparatus comprising an etching apparatus, a CVD apparatus, a sputtering apparatus, an exposure apparatus or an oxidation apparatus;
    storing, as apparatus property data, plasma densities or particle numbers resulting from performing a second group of processes using the process-performing apparatus;
    determining whether a state of a process which is included in both the first group and the second group and has been performed using the process-performing apparatus is satisfactory, based on the process result data and the apparatus property data; and
    calculating an estimated process rate wherein the process result data is used as the estimated process rate when the state of the process is determined to be satisfactory while actual data obtained by actually performing the process using the process-performing apparatus is used as the estimated process rate when the state of the process is determined to be unsatisfactory.

2. A process rate calculation method comprising the steps of:
    storing, as process result data, etching rates resulting from performing a first group of processes using an etching apparatus;
    storing, as apparatus property data, particle numbers resulting from performing a second group of processes using the etching apparatus;
    determining whether a state of a process which is included in both the first group and the second group and has been performed using the etching apparatus is satisfactory; and
    calculating an estimated etching rate wherein the process result data is used as the estimated etching rate when the state of the process is determined to be satisfactory while actual data obtained by actually performing the process using the etching apparatus is used as the estimated etching rate when the state of the process is determined to be unsatisfactory.

3. The process rate calculation method of claim 2, wherein the step of determining the state of the process includes:
    a step of calculating a first standard deviation of a predetermined amount of the process result data;
    a step of calculating a second standard deviation of a predetermined amount of the apparatus property data; and a step of determining that the state of the process is satisfactory if an average of the first standard deviation and the second standard deviation is smaller than a predetermined value.

4. The process rate calculation method of claim 3, wherein the step of calculating the first standard deviation includes:

a step of weighting the latest etching rate of etching rates contained in the predetermined amount of the process result data, and the step of calculating the second standard deviation including a step of weighting the latest particle number of particle numbers contained in the predetermined amount of the apparatus property data.

5. The process rate calculation method of claim 2, wherein the step of determining the state of the process includes:

a step of calculating a first value comprising a deviation, a sum-of-squares, a dispersion, a range or a change rate, of a predetermined amount of the process result data;

a step of calculating a second value comprising a deviation, a sum-of-squares, a dispersion, a range or a change rate, of a predetermined amount of the apparatus property data; and a step of determining that the state of the process is determined to be satisfactory if an average of the first value and the second value is smaller than a predetermined value.

6. The process rate calculation method of claim 2, wherein the step of calculating the estimated etching rate includes a step of calculating an average of etching rates contained in a predetermined amount of the process result data as the estimated etching rate when the process result data is used as the estimated etching rate.

7. The process rate calculation method of claim 6, wherein the step of calculating an average of etching rates contained in the predetermined amount of the process result data includes a step of weighting the latest etching rate of the etching rates contained in the predetermined amount of the process result data.

* * * * *